United States Patent
Soundararajan et al.

(10) Patent No.: US 11,088,702 B2
(45) Date of Patent: *Aug. 10, 2021

(54) ANALOG-TO-DIGITAL CONVERTER WITH INTERPOLATION

(71) Applicant: TEXAS INSTRUMENTS INCORPORATED, Dallas, TX (US)

(72) Inventors: Rishi Soundararajan, Bengaluru (IN); Visvesvaraya Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/856,167

(22) Filed: Apr. 23, 2020

(65) Prior Publication Data

US 2020/0252076 A1 Aug. 6, 2020

Related U.S. Application Data

(63) Continuation of application No. 16/217,643, filed on Dec. 12, 2018, now Pat. No. 10,673,452.

(51) Int. Cl.
*H03M 1/20* (2006.01)
(52) U.S. Cl.
CPC ........... *H03M 1/207* (2013.01); *H03M 1/204* (2013.01); *H03M 1/206* (2013.01)
(58) Field of Classification Search
CPC .......................................... H03M 1/202–1/207
(Continued)

(56) References Cited

U.S. PATENT DOCUMENTS

| 5,317,721 A | 5/1994 | Robinson |
| 5,495,247 A | 2/1996 | Yamamoto et al. |

(Continued)

FOREIGN PATENT DOCUMENTS

| JP | 105206801 | 8/1993 |
| JP | 2001044806 | 2/2001 |

(Continued)

OTHER PUBLICATIONS

U.S. Appl. No. 16/517,796, Notice of Allowance, dated Feb. 6, 2020, p. 7.

(Continued)

*Primary Examiner* — Khai M Nguyen
(74) *Attorney, Agent, or Firm* — Mark Allen Valetti; Charles A. Brill; Frank D. Cimino

(57) ABSTRACT

A method of converting an analog signal to a digital code, comprising: using a first comparator to receive an input signal and a first comparison signal, and to generate a first output as a function of the input signal and the first comparison signal; using a second comparator to receive the input signal and a second comparison signal, and to generate a second output as a function of the input signal and the second comparison signal; and using an interpolation comparator to receive the first and second outputs, and to generate a third output based on relative timing of the first and second outputs; further including multiplexing to permit a second-level comparator to receive timing signals from the interpolation comparator and only one of two dummy comparators.

6 Claims, 6 Drawing Sheets

(58) Field of Classification Search
USPC .................................. 341/155–156, 158–159
See application file for complete search history.

(56) References Cited

U.S. PATENT DOCUMENTS

| | | | |
|---|---|---|---|
| 5,563,533 | A | 10/1996 | Cave et al. |
| 5,821,780 | A | 10/1998 | Hasegawa |
| 6,046,612 | A | 4/2000 | Taft |
| 6,144,231 | A | 11/2000 | Goldblatt |
| 6,822,596 | B2 | 11/2004 | Theiler |
| 7,233,172 | B2 | 6/2007 | Kanamori et al. |
| 7,262,724 | B2 | 8/2007 | Hughes et al. |
| 7,501,862 | B2 | 3/2009 | Su et al. |
| 7,525,471 | B2 | 4/2009 | Prodic et al. |
| 7,557,746 | B1 | 7/2009 | Waltari |
| 7,737,875 | B2 * | 6/2010 | Waltari ............ H03M 1/206 341/158 |
| 7,847,576 | B2 | 12/2010 | Koima |
| 7,916,064 | B2 | 3/2011 | Lin et al. |
| 8,089,388 | B2 | 1/2012 | Cui et al. |
| 8,130,130 | B2 | 3/2012 | Danjo et al. |
| 8,183,903 | B2 | 5/2012 | Glass et al. |
| 8,373,444 | B2 | 2/2013 | Lee et al. |
| 8,773,169 | B2 | 7/2014 | Dinc et al. |
| 8,836,375 | B2 | 9/2014 | Ghatak |
| 8,896,476 | B2 | 11/2014 | Harpe |
| 9,369,137 | B2 | 6/2016 | Masuko |
| 9,455,695 | B2 | 9/2016 | Kull et al. |
| 9,685,971 | B2 | 6/2017 | Harada |
| 9,917,590 | B2 | 3/2018 | Zhang et al. |
| 10,003,353 | B2 | 6/2018 | Kris et al. |
| 10,284,188 | B1 | 3/2019 | Soundararajan et al. |
| 2005/0104626 | A1 | 5/2005 | Wakamatsu et al. |
| 2012/0105264 | A1 | 5/2012 | Ryu et al. |
| 2012/0176158 | A1 | 7/2012 | Lee et al. |
| 2013/0021118 | A1 | 1/2013 | Kabir et al. |
| 2013/0009796 | A1 | 10/2013 | Sakiyama et al. |
| 2014/0361917 | A1 | 12/2014 | Matsuno et al. |

FOREIGN PATENT DOCUMENTS

| | | |
|---|---|---|
| KR | 20000028857 | 5/2000 |
| KR | 20020015863 | 3/2002 |

OTHER PUBLICATIONS

U.S. Appl. No. 16/410,698, Notice of Allowance, dated Feb. 10, 2020, p. 6.

International Search Report in corresponding PCT Patent Application No. PCT/2018-068162, dated Apr. 25, 2019 (2 pages).

* cited by examiner ically designate like elements, there is shown in FIG. 1
ANALOG-TO-DIGITAL CONVERTER WITH INTERPOLATION

CROSS-REFERENCE TO RELATED APPLICATIONS

This continuation application claims priority to U.S. patent application Ser. No. 16/217,643, filed Dec. 12, 2018, which is incorporated herein by reference in their entirety.

BACKGROUND

An analog-to-digital (A/D) converter (ADC) may be used to generate digital codes which represent the level of an analog signal. A direct radio-frequency (RF) sampling receiver may be used to receive and directly digitize a high frequency analog signal. An analog-to-digital converter for digitizing a signal in a direct radio-frequency sampling receiver may be required to operate at high speed.

SUMMARY

This disclosure relates to an analog-to-digital converter which has first and second comparators and an interpolation comparator. The first comparator receives an input signal and a comparison signal, and generates an output as a function of the input signal and the comparison signal. The second comparator receives the input signal and a second comparison signal (different from the first comparison signal), and generates a second output as a function of the input signal and the second comparison signal. The interpolation comparator is operatively connected to the first and second comparators. The interpolation comparator receives the first and second outputs, and generates a third output based on relative timing of the first and second outputs.

This disclosure also relates to a method of converting an analog signal to a digital code. The method includes (A) using a first comparator to receive an input signal and a first comparison signal, and to generate a first output as a function of the input and first comparison signals; (B) using a second comparator to receive the input signal and a second comparison signal, and to generate a second output as a function of the input and second comparison signals; and (C) using an interpolation comparator to receive the first and second outputs, and to generate an output based on relative timing of the first and second outputs.

BRIEF DESCRIPTION OF THE DRAWINGS

FIG. 3 illustrates an interpolation concept;

FIG. 5 illustrates an extension of the concept illustrated in FIG. 3 by showing a cascade of interpolation stages;

FIG. 6 illustrates an extension, to multiple levels, of the concepts illustrated in FIGS. 3 and 5

DETAILED DESCRIPTION

Figure 1:
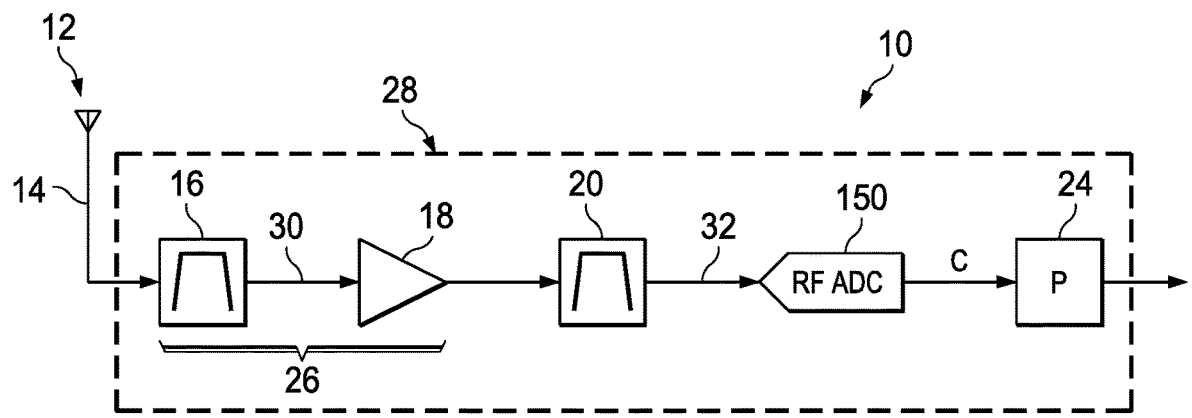
FIG. 1 is a block diagram of an example of a direct radio-frequency sampling receiver.
Figure 10:
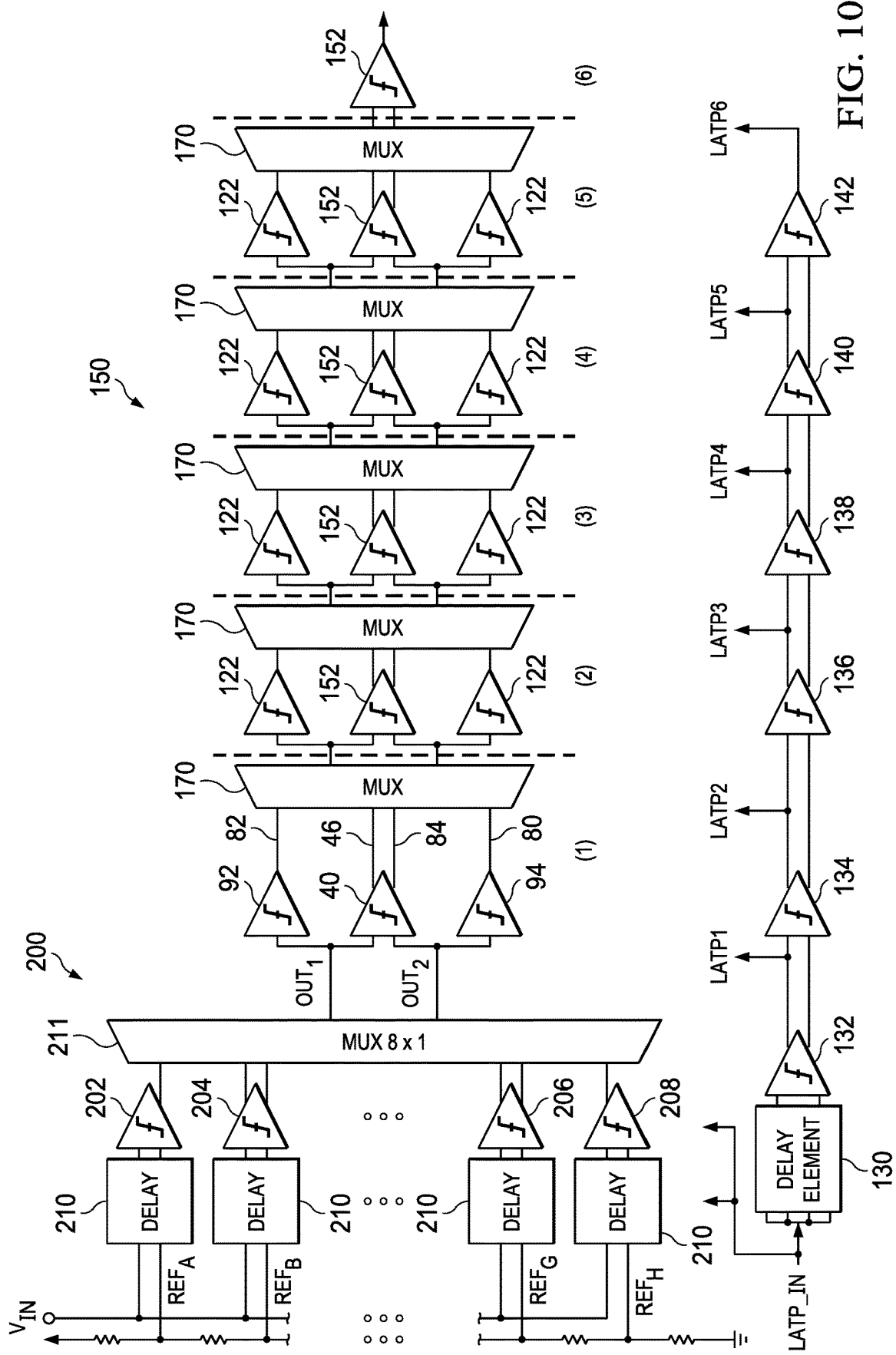
FIG. 10 is a block diagram of an example of a nine-bit analog-to-digital converter, in which an example of a six-bit interpolation-type analog-to-digital converter is operatively connected to, and overlaps, a three-bit flash-type analog-to-digital converter.

Referring now to the drawings, where like reference numerals designate like elements, there is shown in FIG. 1 a direct radio-frequency sampling receiver 10 which has an antenna 12, a first bandpass filter 16 for receiving a radio-frequency signal from the antenna 12 (on a conductive line 14), a low-noise amplifier 18, a narrow bandpass filter 20, an interpolation-type analog-to-digital converter 150 for generating digital codes C, and a signal-processing circuit 24 for processing the digital codes C. The first bandpass filter 16 and the low-noise amplifier 18 constitute an analog front end (AFE) 26 of the receiver 10. An example of the analog-to-digital converter 150 is illustrated in FIG. 10 and described in more detail below.

According to this disclosure, at least the analog front end 26, the analog-to-digital converter 150, and at least a portion of the signal-processing circuit 24 are operatively connected to each other and integrated into an integrated circuit (IC) and/or a chip 28 fabricated according to various semiconductor and/or other processes. One or more conductive lines 14, 30, 32 and other devices and elements of the receiver 10 may be diffused or implanted into one or more layers of semiconductor material (not illustrated). The integrated devices and elements 14, 150, 24, 26, 30, 32 include transistors, resistors, and other suitable electronic devices that are not shown in the drawings for the sake of clarity.

In the illustrated configuration, the first bandpass filter 16 is a wideband, low-loss, preselect device, and provides most of the desired out-of-band rejection for the receiver 10. The first bandpass filter 16 prevents signals that are far from the desired passband from saturating the analog front end 26 of the receiver 10. The low-noise amplifier 18 increases the amplitude of weak signals on conductive line 30. In the illustrated configuration, the narrow bandpass filter 20 is a surface acoustic wave (SAW) device, and transmits a radio-frequency signal on line 32 to the analog-to-digital converter 150. This disclosure is not limited, however, to the details and specific features of the illustrated configuration.

The analog-to-digital converter 150 operates in time domain and uses differential comparators to perform time-based interpolations, as discussed in more detail below. The converter 150 is capable of operating at high speed. For these and other reasons, the illustrated receiver 10 does not require a mixer (or a local oscillator) for translating a radio-frequency signal into an intermediate frequency (IF) signal. However, again, this disclosure is not limited to the specific devices and elements shown in the drawings and described herein.

We turn now to a discussion of time-based interpolation. The output voltage $V_{OUT}$ of a typical comparator with respect to the elapsed time t from when the comparator is triggered, up until the output voltage $V_{OUT}$ reaches a saturation voltage $V_{DD}$, is as follows:

$$V_{OUT}(t) = V_{IN,COMP} * e^{(t/\tau)} \quad \text{(Equation 1)},$$

where $V_{OUT}(t)$ is the output voltage of the typical comparator over time, $V_{IN,COMP} = (V_{INP} - V_{INM}) - (REF_P - REF_M)$, $V_{INP}$, $V_{INM}$, $REF_P$, and $REF_M$ are single-ended voltages applied to the comparator, such that the input voltage $V_{IN}$ (FIG. 2) (an example of an input signal) applied to the non-inverting input of the comparator is $V_{INP} - V_{INM}$, and the reference voltage REF applied to the inverting input of the comparator is $REF_P - REF_M$, and $\tau$ is the regenerative time constant of the comparator.

The time $T_O$ that it takes for the output voltage $V_{OUT}$ of the typical comparator to reach the saturation voltage $V_{DD}$, from the triggering of the comparator, which is referred to herein as the "delay" of the comparator, is a function of the difference $V_{IN,COMP}$ between the input and reference voltages $V_{IN}$, REF, as follows:

$$T_O = \tau * \ln(V_{DD}/V_{IN,COMP}) + \tau_{CONST} \quad \text{(Equation 2)},$$

where $T_{CONST}$ is a delay constant for the comparator.

Figure 2:
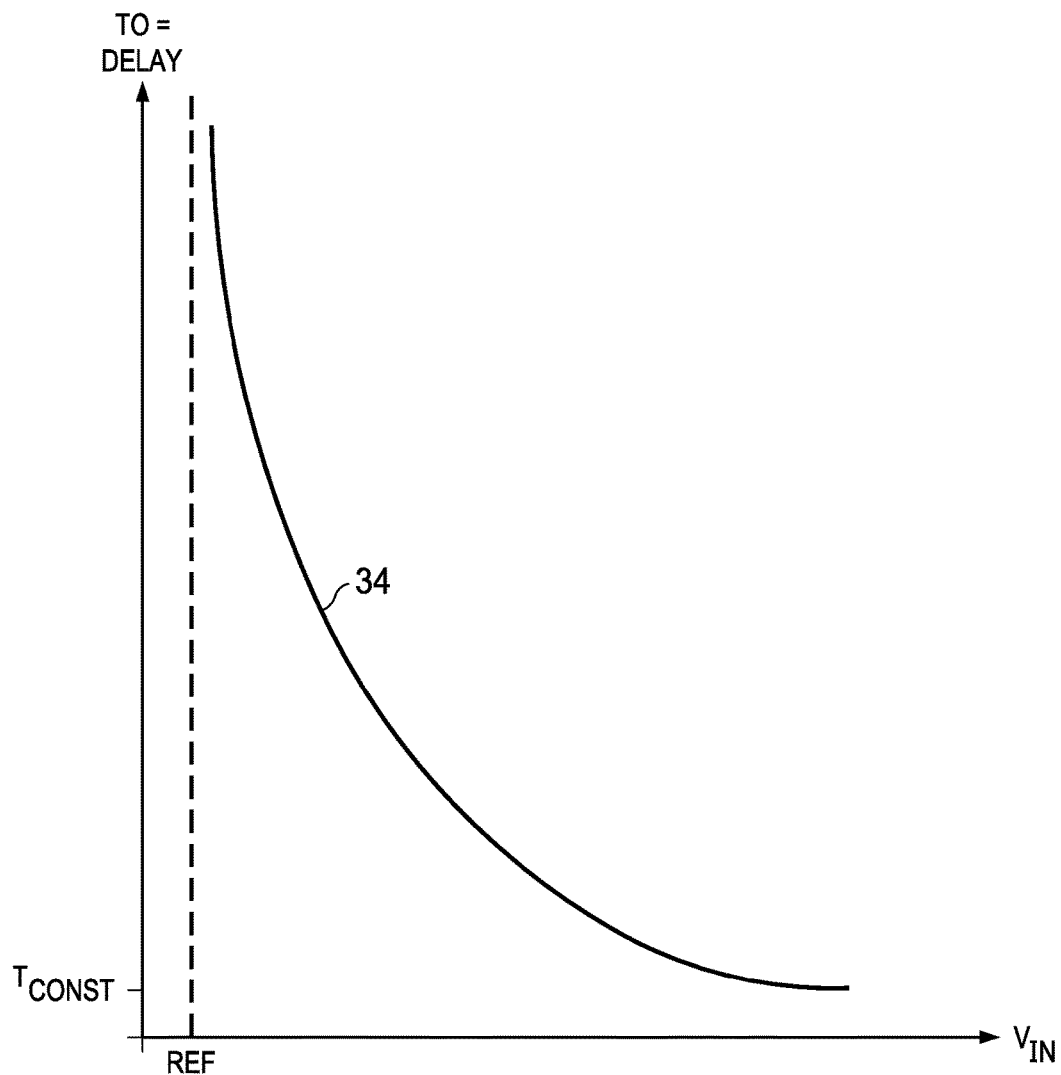
FIG. 2 is a graph which illustrates a delay profile for a typical comparator.

The typical comparator's output delay $T_O$ increases exponentially as the input voltage $V_{IN}$ moves closer to the comparator's threshold REF (an example of a comparison signal). As illustrated in FIG. 2, the typical comparator has a delay profile 34 characterized by (1) a large delay $T_O$ when the input voltage $V_{IN}$ is relatively close to the reference voltage REF (that is, when the difference $V_{IN,COMP}$ between the input voltage $V_{IN}$ and the comparator threshold REF is relatively close to zero) and (2) a relatively small delay $T_O$ (approaching the delay constant $T_{CONST}$ of the comparator) when the input voltage $V_{IN}$ is relatively far from the threshold REF.

Figure 3:
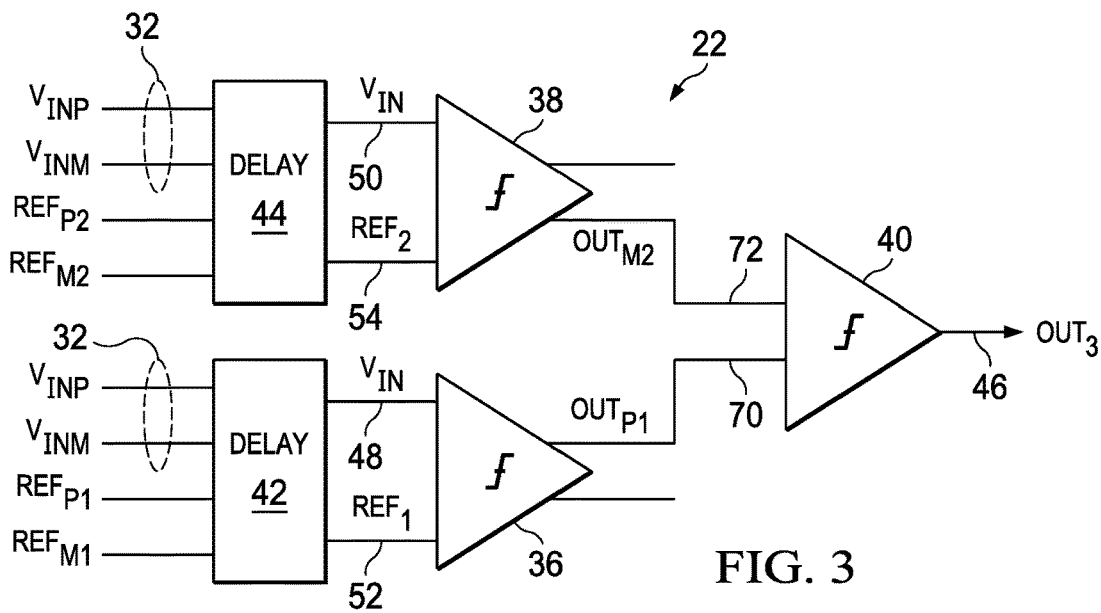
FIG. 3 is a block diagram of an example of an analog-to-digital converter.

As illustrated in FIG. 3, an analog-to-digital converter 22 has first, second, and third comparators 36, 38, 40, and first and second delay circuits 42, 44. The first and second comparators 36, 38 are essentially identical to each other, and the delay circuits 42, 44 are essentially identical to each other. The third comparator (also referred to herein as an interpolation comparator) 40 provides binary information $OUT_3$ on a non-inverted output line 46, as discussed in more detail below. The information $OUT_3$ can be used by the signal-processing circuit 24 (FIG. 1) as a digital, single-bit code C representative of the input voltage $V_{IN}$.

In operation, the delay circuits 42, 44 (FIG. 3) each convert single-ended complementary input voltages $V_{INP}$, $V_{INM}$ into the input voltage $V_{IN}$ ($=V_{INP}-V_{INM}$), and apply the input voltage $V_{IN}$ to non-inverting inputs 48, 50 of the first and second comparators 36, 38. The first delay circuit 42 also converts single-ended complementary reference voltages $REF_{P1}$, $REF_{M1}$ into a first reference voltage $REF_1$ ($=REF_{P1}-REF_{M1}$), which is applied to an inverting input 52 of the first comparator 36, and the second delay circuit 44 converts single-ended complementary reference voltages $REF_{P2}$, $REF_{M2}$ into a second reference voltage $REF_2$ ($=REF_{P2}-REF_{M2}>REF_1$), which is applied to an inverting input 4 of the second comparator 38. In the illustrated example, the first and second reference voltages $REF_1$, $REF_2$ are different from each other.

The first and second comparators 36, 38 are essentially identical to each other, and generate a non-inverted output $OUT_{P1}$ and an inverted output $OUT_{M2}$, respectively, in each case as a function of their respective inputs. The non-inverted output $OUT_{P1}$ of the first comparator 36 is applied to an inverting input 70 of the interpolation comparator 40, and the inverted output $OUT_{M2}$ of the second comparator 38 is applied to a non-inverting input 72 of the interpolation comparator 40.

Figure 4:
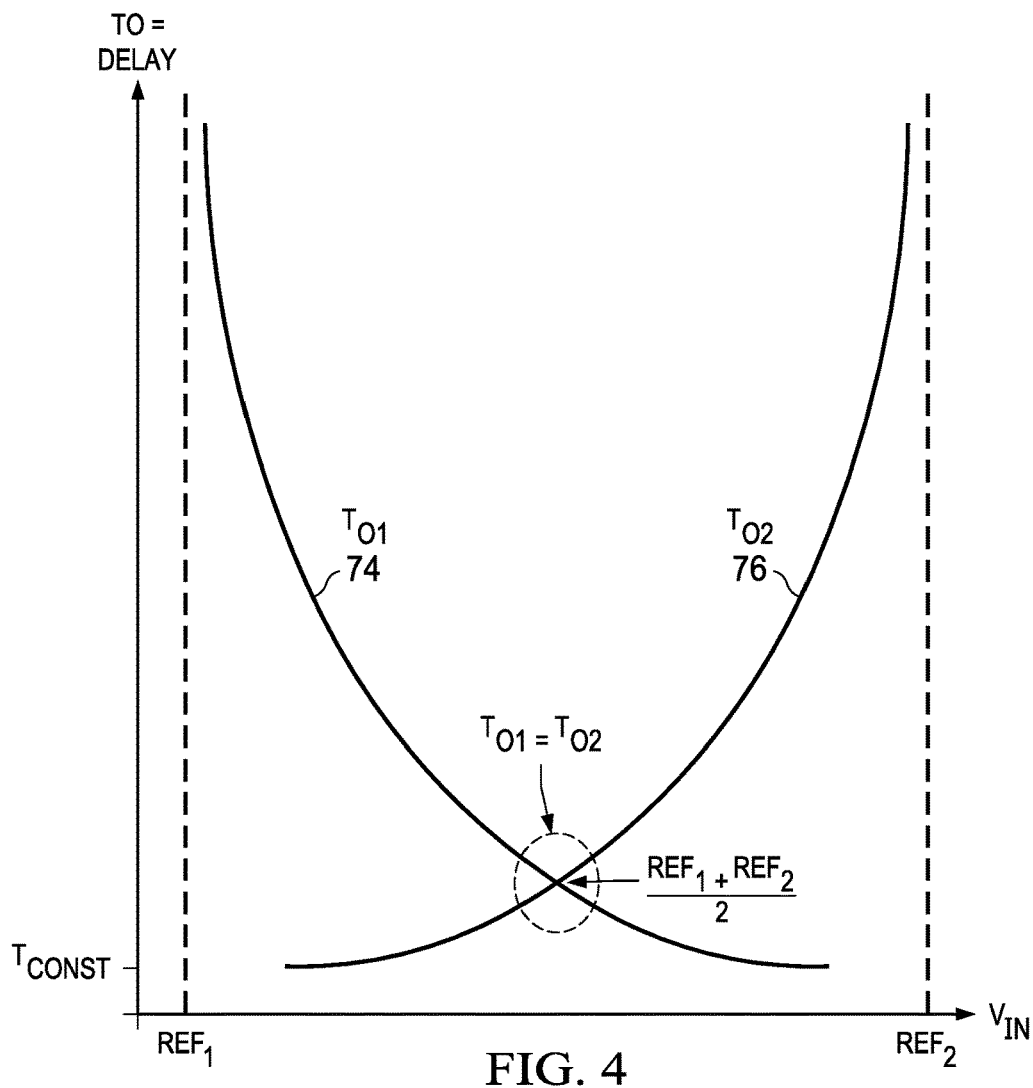
FIG. 4 is a graph which illustrates delay profiles for comparators of the analog-to-digital converter of FIG. 3.

The delay profiles 74, 76 of the first and second comparators 36, 38 are shown in FIG. 4. In the illustrated example, the input voltage $V_{IN}$ is less than the second reference voltage $REF_2$, but greater than the first reference voltage $REF_1$ (that is, $REF_2>V_{IN}>REF_1$). As illustrated in FIG. 4, when the input voltage $V_{IN}$ ($=V_{INP}-V_{INM}$) is relatively close to the threshold $REF_1$ of the first comparator 36, the delay $T_{O1}$ of the first comparator 36 is relatively large, and the delay $T_{O2}$ of the second comparator 38 is relatively small (approaching the delay constant $T_{CONST}$). On the other hand, when the input voltage $V_{IN}$ is relatively close to the threshold $REF_2$ of the second comparator 38, the delay $T_{O1}$ of the first comparator 36 is relatively small (approaching the delay constant $T_{CONST}$), and the delay $T_{O2}$ of the second comparator 38 is relatively large.

The delay profiles 74, 76 for the first and second comparators 36, 38 intersect (that is, $T_{O1}=T_{O2}$) when the input voltage $V_{IN}$ is midway between the thresholds $REF_1$, $REF_2$ of the comparators 36, 38 [that is, when $V_{IN}=(REF_1+REF_2)/2$], as can be demonstrated by applying the input values $V_{IN}$, $REF_1$, and $REF_2$ to Equation 2, as follows:

$$T_{O1} = \tau * \ln[V_{DD}/(V_{IN} - REF_1)] + T_{CONST}$$

$$T_{O2} = \tau * \ln[V_{DD}/(REF_2 - V_{IN})] + T_{CONST} \text{(since } V_{IN} < REF_2)$$

$$T_{O1} - T_{O2} = \tau * \ln[V_{DD}/(V_{IN} - REF_1)] - \tau * \ln[V_{DD}/(REF_2 - V_{IN})] =$$

$$\tau * \ln[(REF_2 - V_{IN})/(V_{IN} - REF_1)]$$

$$\therefore T_{O1} - T_{O2} = 0, \text{ that is, } T_{O1} = T_{O2}, \text{ when}$$

$$V_{IN} = (REF_1 + REF_2)/2$$

When the threshold $REF_2$ of the second comparator 38 is greater than the threshold $REF_1$ of the first comparator 36 (that is, when $REF_2>REF_1$), and the input voltage $V_{IN}$ is closer to the second comparator threshold $REF_2$ [that is, $V_{IN}>(REF_1+REF_2)/2$], then the non-inverted output $OUT_{P1}$ of the first comparator 36 goes high ('+'ve) before the inverted output $OUT_{M2}$ of the second comparator 38 goes high ('+'ve). As a result, the non-inverted output $OUT_{P1}$ of the first comparator 36 ('+'ve) rises on the inverting input 70 of the interpolation comparator 40 before the inverted output $OUT_{M2}$ ('+'ve) of the second comparator 38 rises on the non-inverting input 72 of the interpolation comparator 40, such that the non-inverted output $OUT_3$ generated by the interpolation comparator 40 (on line 46) goes low ('−'ve). That is, when $REF_2>REF_1$, and $V_{IN}>(REF_1+REF_2)/2$, then $T_{O1}<T_{O2}$, such that $OUT_3='-'$ve.

On the other hand, when the threshold $REF_2$ of the second comparator 38 is greater than the threshold $REF_1$ of the first comparator 36, but the input voltage $V_{IN}$ is closer to the first comparator threshold $REF_1$ [that is, $V_{IN}<(REF_1+REF_2)/2$], then the inverted output $OUT_{M2}$ of the second comparator 38 goes high before the non-inverted output $OUT_{P1}$ of the first comparator 36 goes high. As a result, the inverted output $OUT_{M2}$ ('+'ve) rises on the non-inverting input 72 of the interpolation comparator 40 before the non-inverted output $OUT_{P1}$ ('+'ve) rises on the corresponding inverting input 70. The relative timing of the inverted output $OUT_{M2}$ and the non-inverted output $OUT_{P1}$ is such that the non-inverted output $OUT_3$ of the third comparator 40 (an example of an interpolation signal) goes high ('+'ve). That is, when $REF_2>REF_2$, and $V_{IN}<(REF_1+REF_2)/2$, then $T_{O1}>T_{O2}$, such that $OUT_3=$'+'ve.

The output $OUT_3$ of the third comparator 40 toggles when the input voltage $V_{IN}$ crosses the voltage that is midway between the thresholds $REF_1$, $REF_2$ of the first and second comparators 36, 38. In effect, the midway voltage $(REF_1+REF_2)/2$ is the threshold of the interpolated comparator 40, and the signal-processing circuit 24 (FIG. 1) can be provided with a single bit of information from the output signal $OUT_3$ (on line 46), as follows: If the output signal $OUT_3$ is low ('-'ve), then the input voltage $V_{IN}$ is closer to the second comparator threshold $REF_2[V_{IN}>(REF_1+REF_2)/2]$, but if the output signal $OUT_3$ is high ('+'ve), then the input voltage $V_{IN}$ is less than the midway threshold $(REF_1+REF_2)/2$.

Figure 5:
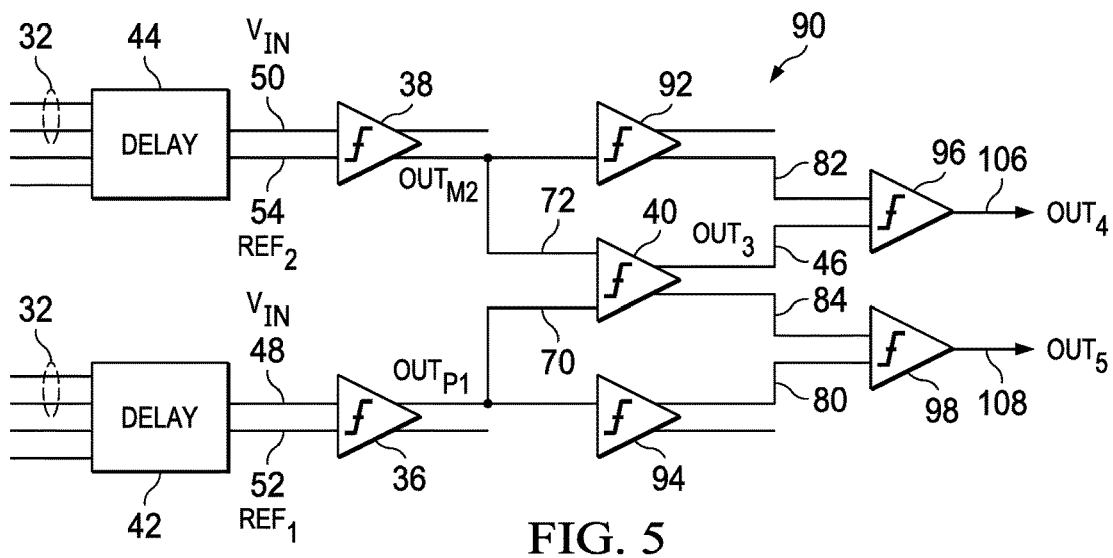
FIG. 5 is a block diagram of another example of an analog-to-digital converter.

FIG. 5 shows an analog-to-digital converter 90 which, compared to the converter 22 shown in FIG. 3, uses an additional level of interpolation to obtain information representative of the input voltage $V_{IN}$ with an additional level of resolution. The illustrated converter 90 has first and second dummy comparators 92, 94, aligned timing-wise with the first interpolation comparator 40, and second and third interpolation comparators 96, 98. The inverted output $OUT_{M2}$ generated by the second comparator 38 is connected to an inverting input of the first dummy comparator 92, and the non-inverted output $OUT_{P1}$ of the first comparator 36 is connected to a non-inverting input of the second dummy comparator 94.

Non-inverted outputs 80, 46 of the second dummy comparator 94 and the first interpolation comparator 40 are connected to inverting inputs of the third and second interpolation comparators 98, 96, respectively, while inverted outputs 82, 84 of the first dummy comparator 92 and the first interpolation comparator 40 are connected to non-inverting inputs of the second and third interpolation comparators 96, 98, respectively.

The first and second dummy comparators 92, 94 are constant delay elements, and are used to preserve delay information $T_{C1}$, $T_{C2}$ generated by the second and first comparators 38, 36, respectively. The threshold for the second interpolation comparator 96 is where (1) the sum of the delay $T_{C2}$ of the second comparator 38 and the delay $T_{DUMMY1}$ of the first dummy comparator 92 is the same as (2) the sum of the delay $T_{C1}$ of the first comparator 36 and the delay $T_{C3}$ of the first interpolation comparator 40 (that is, where $T_{C2}+T_{DUMMY1}=T_{C1}+T_{C3}$). Meanwhile, the threshold for the third interpolation comparator 98 is where (1) the sum of the delay $T_{C1}$ of the first comparator 36 and the delay $T_{DUMMY2}$ of the second dummy comparator 94 is the same as (2) the sum of the delay $T_{C2}$ of the second comparator 38 and the delay $T_{C3}$ of the first interpolation comparator 40 (that is, where $T_{C1}+T_{DUMMY2}=T_{C2}+T_{C3}$).

The dummy comparators 92, 94 are constant delay elements and are trimmed to provide desired thresholds for the second and third interpolation comparators 96, 98. In the illustrated embodiment, the threshold for the second interpolation comparator 96 is ideally midway between the threshold $REF_2$ of the second comparator 38 and the threshold $(REF_1+REF_2)/2$ of the first interpolation comparator 40. That is, the threshold for the second interpolation comparator 96 is ideally $(3REF_2+REF_1)/4$. Similarly, the threshold for the third interpolation comparator 98 is ideally midway between the threshold $(REF_1+REF_2)/2$ of the first interpolation comparator 40 and the threshold $REF_1$ of the first comparator 36. That is, the threshold for the third interpolation comparator 98 is ideally $(3REF_1+REF_2)/4$.

The output signal $OUT_4$ of the second interpolation comparator 96 (an example of an interpolation signal) toggles when the input voltage $V_{IN}$ crosses the comparator's threshold $(3REF_2+REF_1)/4$. Likewise, the output signal $OUT_5$ of the third interpolation comparator 98 toggles when the input voltage $V_{IN}$ crosses the threshold $(REF_2+3REF_1)/4$ of the third interpolation comparator 98. The signal-processing circuit 24 of the receiver 10 can obtain information from one of the second and third interpolation comparators 96, 98 which, together with information received from the first interpolation comparator 40, can be used to place the input voltage $V_{IN}$ within one of four segments between the first and second reference voltages $REF_1$, $REF_2$.

Figure 6:
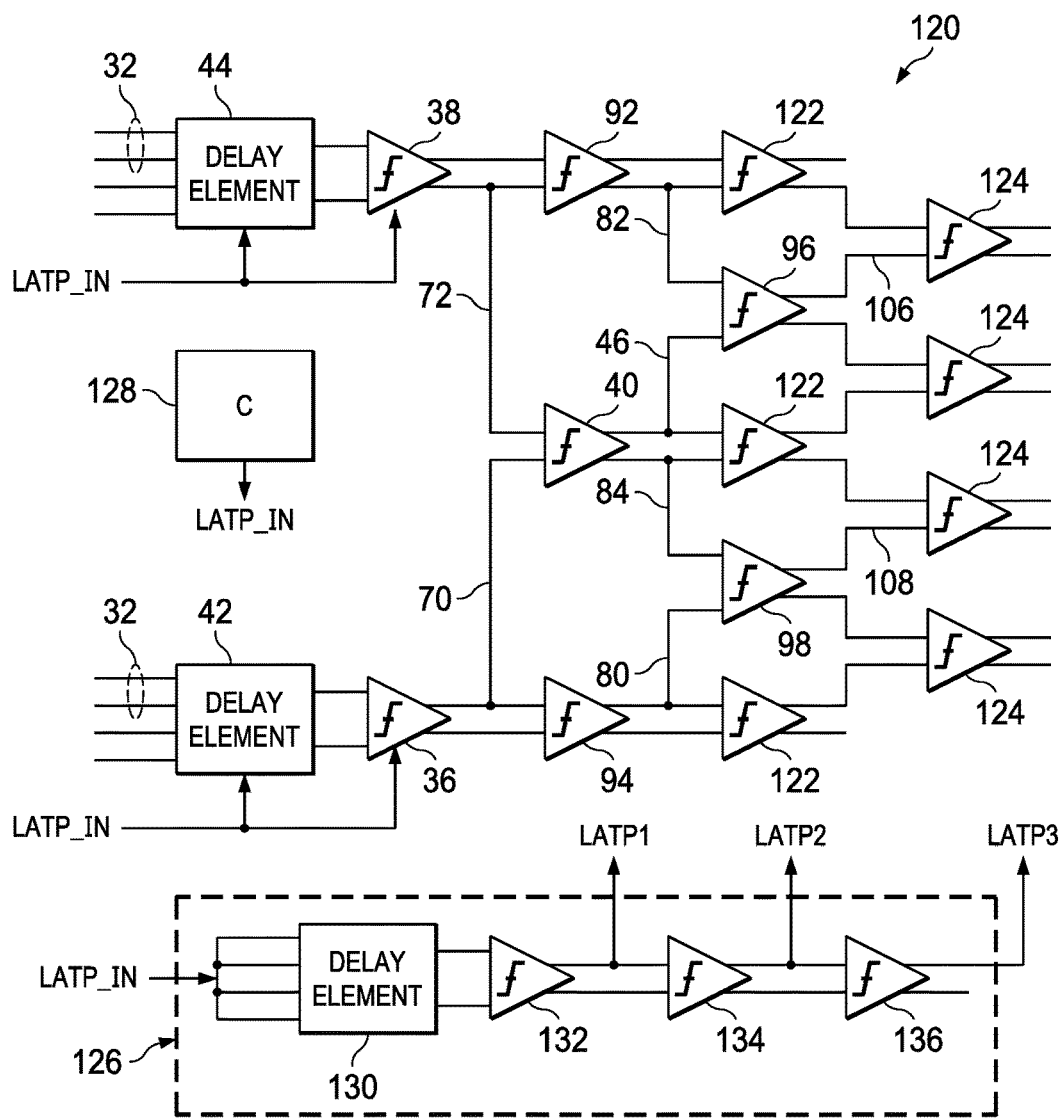
FIG. 6 is a block diagram of yet another example of an analog-to-digital converter.

The interpolation structures described above in connection with FIGS. 3 and 5 can be extended to a third level of interpolation (that is, with an additional level of resolution), as illustrated in FIG. 6. An analog-to-digital converter 120 shown in FIG. 6 has three additional dummy comparators 122, aligned timing-wise with the second and third interpolation comparators 96, 98, and four additional interpolation comparators 124. The thresholds of the additional interpolation comparators 124 are obtained by trimming the delays of the additional dummy comparators 122.

The illustrated converter 120 has a timing-signal subsystem 126 which requires only one clock 128. The subsystem 126 issues an input clock signal LATP_IN to control the delay circuits (elements) 42, 44 and the first and second comparators 36, 38 in each analog-to-digital conversion. The input clock signal LATP_IN is then converted by the subsystem 126 into successive stage clock signals LATP1, LATP2, LATP3 for controlling the successive stages of the conversion. Among other things, information is forwarded to the signal-processing circuit 24 from (1) the first interpolation comparator 40, (2) one of the second and third interpolation comparators 96, 98, and (3) one of the additional interpolation comparators 124, under the control of the first, second, and third successive stage clock signals LATP1, LATP2, LATP3, respectively.

The times that elapse between the input and stage clock signals LATP_IN, LATP1, LATP2, LATP3 are determined by the respective delays of a delay element 130 and serially-connected comparators 132, 134, 136, which correspond to, or are the same as, the first and second delay elements 42, 44, the first and second comparators 36, 38, and the serially-configured dummy comparators 92, 94, 122, respectively. Thus, the clock signals LATP1, LATP2, LATP3 for the successive stages of each conversion are asynchronous, and, since comparators are used as delay elements for determining the timing between the clock signals LATP_IN, LATP1, LATP2, LATP3, the desired timing holds across process corners and temperature variations. Making the comparators for establishing the clock signals LATP1, LATP2 . . . nominally the same as the interpolation and dummy comparators decreases uncertainty that inconsistencies that would adversely affect timing could be generated during manufacturing.

Timing subsystems for the one-bit and two-bit analog-to-digital converters 22, 90 are not illustrated in FIGS. 3 and 5 for the sake of clarity of illustration. The timing subsystems for the one-bit and two-bit converters 22, 90 may be essentially the same as the subsystem 126 illustrated in FIG. 6, except that the timing subsystem for the two-bit converter 90 (FIG. 5) does not have the third timing comparator 136 and does not generate the third stage clock signal LATP3, and the timing subsystem for the one-bit converter 22 (FIG. 3) does not have the second and third timing comparators 134, 136 and does not generate the second and third stage clock signals LATP2, LATP3.

In the illustrated embodiments, all of the interpolation comparators 40, 96, 98, 124 are essentially identical, or at least similar, to each other, and all of the dummy comparators 92, 94, 122 are essentially identical, or at least similar, to each other. Whereas the interpolation comparators 40, 96, 98, 124 and the dummy comparators 92, 94, 122 receive digital signals from the comparators in front of them, the first and second comparators 36, 38 receive an analog input signal (on line 32). The first and second comparators 36, 38 are scaled higher (that is, are bigger in size) than the other comparators 40, 92, 94, 96, 98, 122, 124 in order to accommodate the noise that is within the analog input signal. The interpolation and dummy comparators 40, 92, 94, 96, 98, 122, 124 need not be designed to accommodate noise.

The input voltage $V_{IN}$ needs to be applied to the analog-to-digital converter 22, 90, 120, 150 only for the duration of the delay caused by the first delay elements 42, 44. If the delay elements 42, 44 have, for example, a delay of about fifty picoseconds, then the input voltage only needs to be applied to the converter for about fifty picoseconds from the time when the converter is triggered. In the illustrated configuration, the maximum speed at which the converter can operate may be determined by the time required for the first and second comparators (also referred to herein as the main comparators) 36, 38 to process the input voltage $V_{IN}$ directly.

The main comparators 36, 38 may operate more slowly than the other comparators 40, 92, 94, 96, 98, 122, 124 because only the main comparators 36, 38 are designed for noise. Each level of interpolation provides a gain for the next level of comparators. The last level of comparators (the additional comparators 124 in FIG. 6) have the highest gain. Since the comparators 40, 92, 94, 96, 98, 122, 124 that follow the main comparators 36, 38 each have a gain, the following comparators 40, 92, 94, 96, 98, 122, 124 can be designed to prioritize higher speed of operation and power instead of managing noise and offset.

A feature or advantage of the interpolation configurations described herein is that any meta-stability of the interpolation and dummy comparators 40, 92, 94, 96, 98, 122, 124 should not affect the output code C. Each interpolation comparator 40, 96, 98, 124 takes decision based on which input comes to it faster. If a signal rises first at an inverting input, then the output of the interpolation comparator will be an inverted value of that first-received signal. If the non-inverting input receives a signal first, then the output of the comparator will be the value of that faster, first-received signal. If the comparator is at meta-stability, it will have very high (theoretically infinite) delay, but the interpolation comparator in the next level of interpolation will take decision based on the faster input signal (not from the comparator that is at meta-stability). Therefore, any meta-stability in a comparator in a first interpolation stage should not affect the desired output of a comparator in a second, successive interpolation stage.

We turn now to a discussion of a multiplexing architecture for reducing hardware requirements. In the converter architectures illustrated in FIGS. 3, 5, and 6, the number of comparators increases for every level of interpolation. Each interpolation stage yields one bit of information. If an analog-to-digital converter is required to have an additional i-th level of interpolation to provide an additional i-th bit of information, then, following the architecture pattern described above in connection with FIGS. 3, 5, and 6 (without employing the hardware-reducing architecture described below), the converter would require $2^{i-1}$ more interpolation converters and $2^{i-2}+1$ more dummy comparators (delay elements). Not counting delay elements and comparators that may be employed to generate timing signals, a six-bit analog-to-digital converter under these conditions would require sixty-three comparators and thirty-six dummy comparators (the last level of interpolation does not require dummy comparators).

Figure 7:
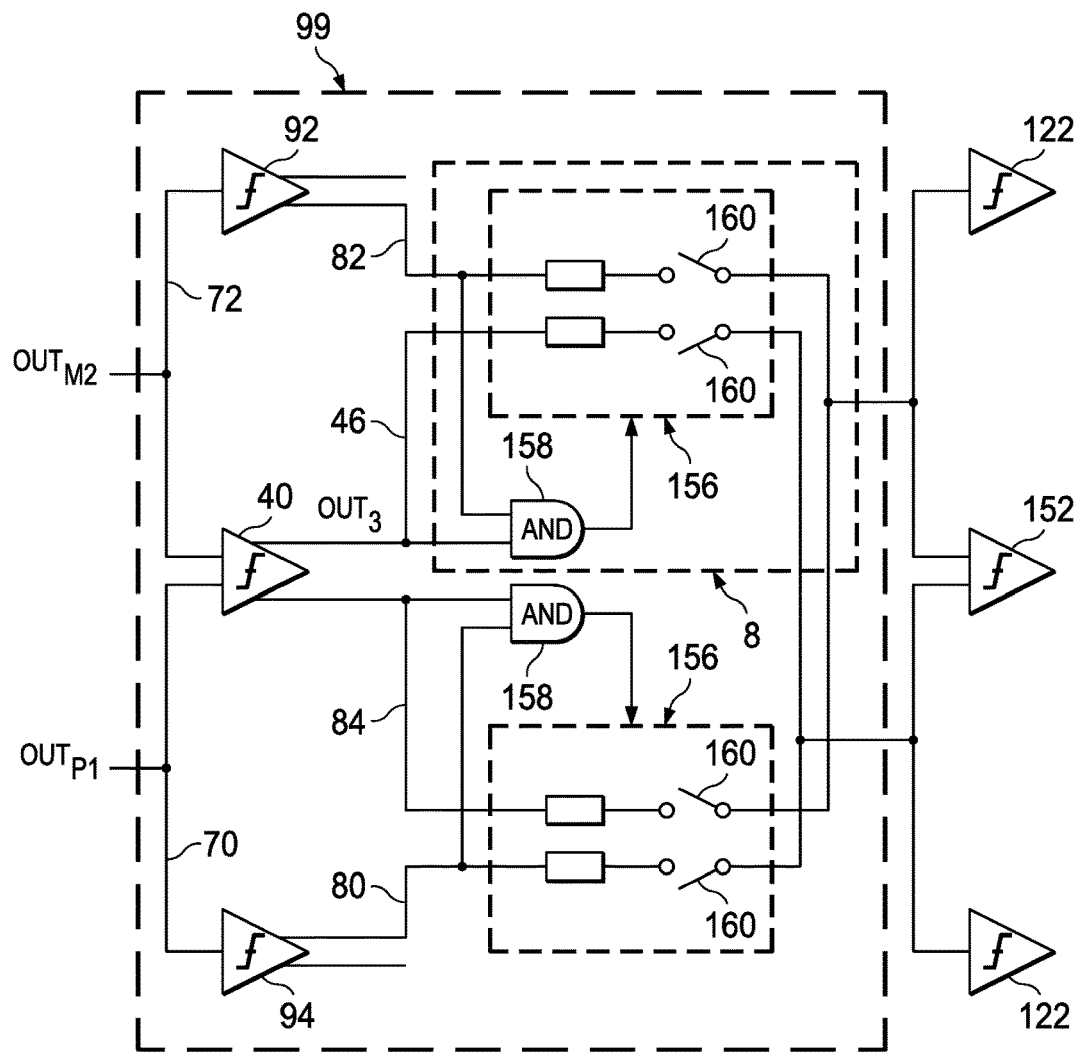
FIG. 7 is a block diagram of a portion of an analog-to-digital converter, with an example of a multiplexing system for reducing hardware requirements.

A multiplexing system can be employed to reduce, and potentially minimize, the number of hardware elements (especially, but not limited to, the number of comparators) required for a desired level of interpolation. FIG. 7 shows a portion of an analog-to-digital converter which has a multiplexing system in accordance with one aspect of this disclosure. In the configuration shown in FIG. 7, the first interpolation comparator 40 (FIGS. 3, 5, 6) and the first dummy comparator 92 (FIG. 7) receive the inverted output $OUT_{M2}$ of the second comparator 38, and the first interpolation comparator 40 and the second dummy comparator 94 receive the non-inverted output of the first comparator 36 (FIGS. 3, 5, 6).

If the input voltage $V_{IN}$ is greater than the threshold voltage $(REF_1+REF_2)/2$ of the first interpolation comparator 40, then information that can be used in the next level of interpolation is present only on the inverted output 82 of the first dummy comparator 92 and the non-inverted output 46 of the first interpolation comparator 40; the inverted output 84 of the first interpolation comparator 40 and the non-inverted output 80 of the second dummy comparator 94 will not have any useful information for the next level of interpolation. On the other hand, if the input voltage $V_{IN}$ is less than the threshold voltage $(REF_1+REF_2)/2$ of the first interpolation comparator 40, then information that can be used in the next level of interpolation is present only on the inverted output 84 of the first interpolation comparator 40 and the non-inverted output 80 of the second dummy comparator 94; the inverted output 82 of the first dummy comparator 92 and the non-inverted output 46 of the first interpolation comparator 40 will not have any useful information for the next level of interpolation.

As illustrated in FIG. 7, multiplexing logic circuitry 99 can be used to pass only the comparator outputs that contain useful information for the next level of interpolation, such that only one interpolation comparator 152 is required for the next level of interpolation, and only two additional (timing-preserving) dummy comparators 122 are required for the level of interpolation which follows the single interpolation comparator 152. For example, instead of the two additional comparators 96, 98 for providing a second level of interpolation in the configurations shown in FIGS. 5 and 6, only the one additional interpolation comparator 152 is required for the second level of interpolation in the configuration shown in FIG. 7.

As illustrated in FIG. 7, the inverted output 82 of the first dummy comparator 92 and the non-inverted output 46 of the first interpolation comparator 40 are applied to (1) a parallel delay and switch element 156 and (2) an AND gate 158, and the inverted output 84 of the first interpolation comparator 40 and the non-inverted output 80 of the second dummy comparator 94 are applied to (1) another parallel delay and switch element 156 and (2) another AND gate 158. The two outputs 82, 46 (84, 80) which contain useful information rise in the same direction and therefore cause the respective AND gate 158 to go high and close switches 160 in the respective parallel delay and switch element 156. The other outputs 84, 80 (82, 46), which do not contain useful information, rise in opposite directions, such that the switches 160 in the other parallel delay and switch element 156 remain open, and the other outputs 84, 80 (82, 46) are not transmitted to the next level of interpolation.

Figure 8:
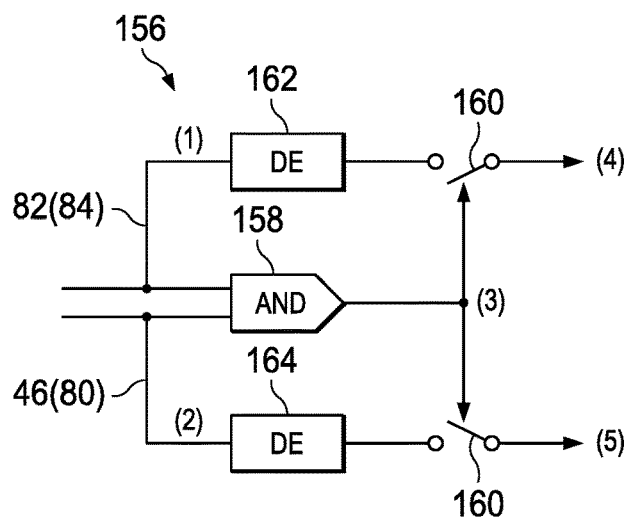
FIG. 8 is a block diagram of an example of logic implemented in a multiplexing subsystem for the converter portion of FIG. 7.

FIG. 8 illustrates with additional detail the structure that is shown within block 8 of FIG. 7. As illustrated in FIG. 8, each parallel delay and switch element 156 has delay units 162, 164 in the respective throughput lines 82, 46 (84, 80). The delay units 162, 164 are in front of the switches 160. Therefore, the AND gate 158 can close the switches 160 in time to preserve the delay information on the throughput lines 82, 46 (84, 80).

Figure 9:
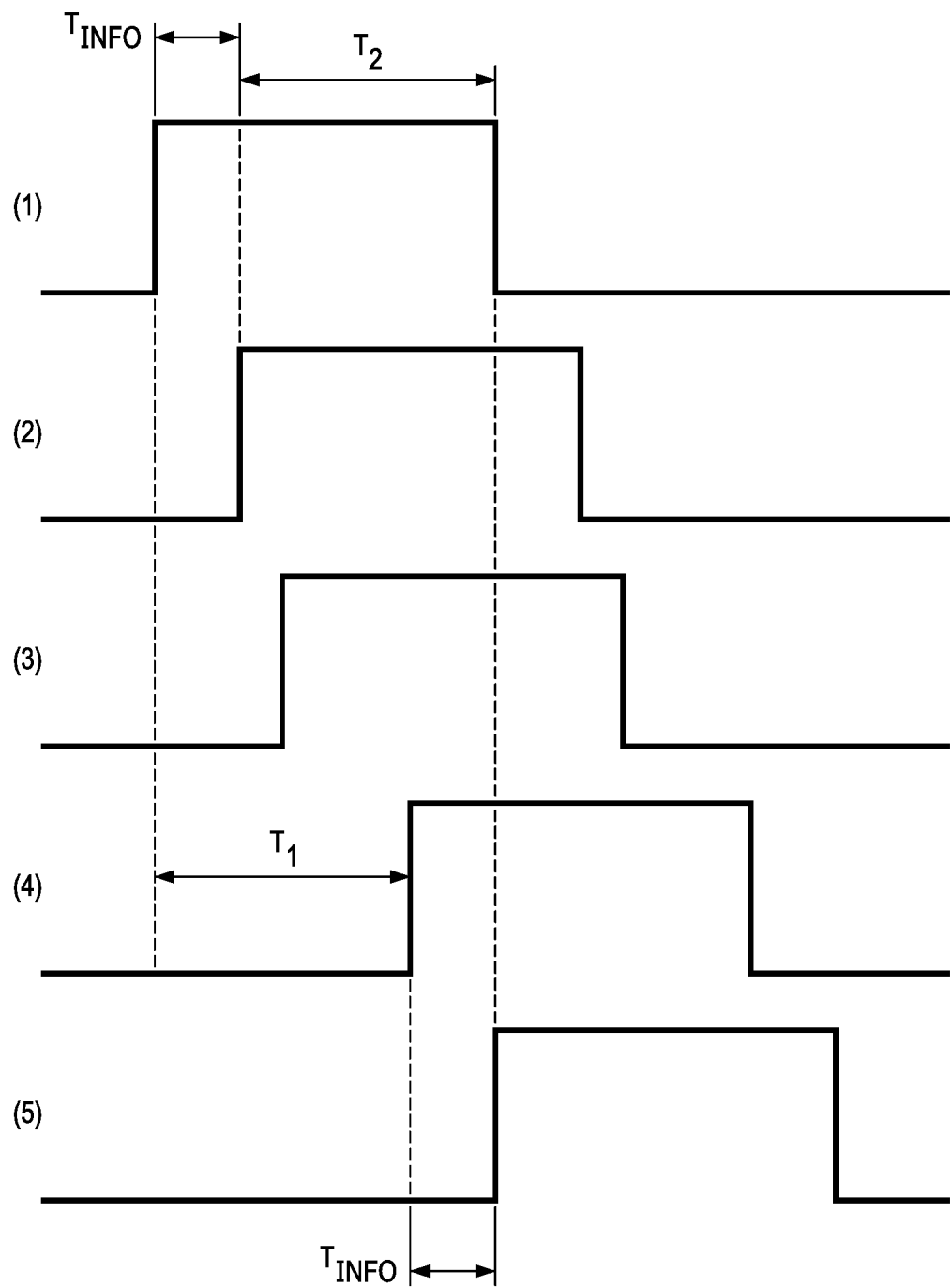
FIG. 9 is a timing diagram for the multiplexing subsystem of FIG. 8.

In FIG. 9, timing line (1) represents the signal on the earlier-rising of the two throughput lines 82, 46 (84, 80) in front of its respective delay unit 162 (164). Timing line (2) represents the signal on the later-rising of the two throughput lines 82, 46 (84, 80) in front of its respective delay unit 164 (162). Timing line (3) represents the signal on the output of the AND gate 158, which closes both of the switches 160 when it goes high. Timing line (4) represents the signal on the earlier-rising of the two throughput lines after the earlier-rising signal is delayed by its respective delay unit, and timing line (5) represents the signal on the later-rising of the two throughput lines after the later-rising signal is delayed by its respective delay unit.

The first and second delay units 162, 164 (FIG. 8) cause identical delays $T_1$, $T_2$ (FIG. 9) such that relative timing information represented by the delay $T_{INFO}$ between, and the order of, the two throughput lines 82, 46 (84, 80) is preserved. In other words, the delays $T_1$, $T_2$ generated by the delay elements 162, 164 ensure that the rising edge of the switch-closing signal (3) occurs before the rising edges of the delayed signals (4), (5). As a result, the timing information $T_{INFO}$ that exists before the switches 160 are closed can be applied to the next level of interpolation after the switches 160 are closed.

In operation, if the output of a first AND gate 158 between the first dummy comparator 92 and the first interpolation comparator 40 goes high, then the signals on the inverted output 82 of the first dummy comparator 92 and the non-inverted output 46 of the first interpolation comparator 40 are applied to the next level of comparators 122, 152. Meanwhile, the output of the other (second) AND gate 158 goes low, such that the switches 160 controlled by the second AND gate 158 are not closed, such that the inverted output 84 of the first interpolation comparator 40 and the non-inverted output 80 of the second dummy comparator 94 are not applied to the next level of interpolation.

On the other hand, if the output of the first AND gate 158 does not go high, then the signals on the inverted output 82 of the first dummy comparator 92 and the non-inverted output 46 of the first interpolation comparator 40 are not applied to the next level of comparators 122, 152, but the output of the second AND gate 158 does go high, such that the switches 160 controlled by the second AND gate 158 are closed. As a result, the inverted output 84 of the first interpolation comparator 40 and the non-inverted output 80 of the second dummy comparator 94 are applied to the next level of interpolation.

The illustrated multiplexing (MUX) architecture 99 allows the useful information (and only the useful information) to pass through to the next level of comparators. As a result, each i-th level of interpolation can operate with only one interpolation comparator (to obtain information for the i-th level) and two dummy delay elements (to preserve timing information for the level after the i-th level). Since no dummy comparators are required for the last level of interpolation, the total number of comparators and delay elements needed for a six-bit analog-to-digital converter (not counting comparators for clock-generated timing) are only six and twelve, respectively.

FIG. 10 shows a six-bit interpolation-type analog-to-digital converter 150 which implements the above-described interpolation and multiplexing architectures. The first, second . . . sixth stages of interpolation are schematically separated from each other in FIG. 10 by vertical dashed lines, and are designated by integers (within parentheses) 1, 2 . . . 6, respectively. The first four pairs of stages 1-2, 2-3, 3-4, 4-5 are each essentially identical to the multiplexing/comparators structure shown in FIG. 7. The five multiplexers (MUX) 170 between the six stages 1-6 each have the multiplexing structure 8, 156, 158, 160, 162, 164 shown in FIGS. 7 and 8. The last pair of stages 5-6 also has the multiplexing/comparators structure shown in FIG. 7 except that the last stage 6 does not require dummy comparators 122.

Information is taken from each stage 1, 2 . . . 6 under the control of a timing subsystem like the subsystem 126 shown in FIG. 6, but with delay comparators 132, 134, 136, 138, 140, 142 for generating six timing signals LATP1, LATP2 . . . LATP3 for controlling the six stages 1-6, respectively. The timing from stage to stage is asynchronous and determined by delays generated by the delay comparators. The delay comparators may be the same as the respective other comparators shown in FIG. 10, so that the desired timing holds across process corners and temperature variations. Making the comparators nominally the same decreases uncertainty that inconsistencies that would adversely affect timing could be generated during manufacturing.

FIG. 10 also shows a three-bit flash-type analog-to-digital converter 200 which uses eight comparators 202, 204 . . . 206, 208 to place an input voltage $V_{IN}$ within one of seven segments established by eight divided threshold voltages $REF_A$, $REF_B$ . . . $REF_G$, $REF_H$. Delay elements 210 (like the delay elements 42, 44 described above) are located in front of the flash comparators 202, 204 . . . 206, 208. The outputs of the flash comparators 202, 204 . . . 206, 208 are multiplexed by a multiplexing circuit (MUX 8×1) 211.

In operation, the outputs of the flash comparators 202, 204 . . . 206, 208, under the control of an input timing signal LATP_IN, are used to generate three bits of information, to place the input voltage $V_{IN}$ between two adjacent ones of the eight divided threshold voltages $REF_A$, $REF_B$ . . . $REF_G$, $REF_H$ (in one example, between the first and second divided threshold values $REF_A$, $REF_B$). The three bits of information are communicated to the signal-processing circuit 24. The multiplexing circuit 211 transmits output signals $OUT_1$, $OUT_2$ from the two flash comparators which received the two adjacent ones of the eight divided threshold voltages (in the one example, from the first and second flash comparators 202, 204).

Then, the output 46 of the first interpolation comparator 40, under the control of a first stage clock signal LATP1, is used to generate an additional bit of information, to place the input voltage $V_{IN}$ closer to one or the other of the adjacent ones of the eight divided threshold voltages (for example, closer to one or the other of the first and second divided threshold values $REF_A$, $REF_B$). The output 46 of the first interpolation comparator 40 is determined by a comparison of the output voltages $OUT_1$, $OUT_2$.

Then, the interpolation comparators 152 in the second through sixth stages 2-6, under the control of successive stage clock signals LATP2, LATP3 . . . LATP6, generate five additional bits of information concerning the value of the input voltage $V_{IN}$. In each stage, timing information contained within signals output from a preceding interpolation comparator 40, 152 and corresponding dummy comparators 92, 122 is selectively passed through a multiplexer 170 and processed by a succeeding interpolation comparator 152.

In other words, the flash-type converter 200 determines the value of the input voltage $V_{IN}$ with three bits of resolution, and generates, as residue, signals which contain the delay (difference in timing) between the two relevant comparator outputs $OUT_1$, $OUT_2$. The residue signals $OUT_1$, $OUT_2$ are processed by the six-bit, interpolation-type, analog-to-digital converter 150 to finally obtain a nine-bit final output code C for each conversion (a nine-bit final output code C is determined for each sampled input voltage $V_{IN}$). The output code C is applied to the signal-processing circuit 24 (FIG. 1).

This disclosure provides many advantages. The illustrated time interpolation configurations may be employed using only, or primarily, comparators and digital logic elements. The use of residue amplifiers, biasing circuits, and reference buffers, which have been required in connection with certain pipeline analog-to-digital converters, may be avoided to reduce power consumption and area requirements (space on the chip 28). Use of the multiplexer logic described herein can minimize, or at least reduce, hardware requirements for an interpolation portion of an analog-to-digital converter, to further contribute to power and area reduction.

The interpolation-type devices described herein do not require amplifiers and they do not have complicated timing requirements. The devices can be operated without biasing circuits, amplifiers, reference buffers, clock generation (delay-locked loop) devices, and rely exclusively, or primarily, on the use of comparators and some digital logic elements. As a result, the interpolation-type devices can operate at high speed with relatively little power consumption for a given process technology.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A method of converting an analog signal to a digital code, comprising:
    using a first comparator to receive an input signal and a first comparison signal, and to generate a first output as a function of the input signal and the first comparison signal;
    using a second comparator to receive the input signal and a second comparison signal, and to generate a second output as a function of the input signal and the second comparison signal; and
    using an interpolation comparator to receive the first and second outputs, and to generate a third output based on relative timing of the first and second outputs;
    further including multiplexing to permit a second-level comparator to receive timing signals from the interpolation comparator and only one of two dummy comparators.

2. A converter comprising:
    a first comparator having a first input coupled to a first reference voltage, a second input coupled to an analog signal and an output;
    a second comparator having a first input coupled to a second reference input, a second input coupled to the analog signal and an output;
    a third comparator having a first input coupled to the output of the first comparator, a second input coupled to the output of the second comparator and an output;
    a signal processor connected to the output of the third comparator, the signal processor operable to provide a converted value of the analog signal; and
    wherein the converted value is greater than half of a sum of the first reference voltage and the second reference voltage when the output of the third comparator is low and less than half of the sum of the first reference voltage and the second reference voltage when the output of the third comparator is high.

3. The converter of claim 2, wherein the converter is an analog-to-digital converter.

4. The converter of claim 3, wherein the converted value is a signal bit code.

5. The converter of claim 4, wherein the third comparator is an interpolation comparator.

6. The converter of claim 5, further comprising $2^{(n-1)}$ interpolation comparators, where the converted value is a n-bit code.

* * * * *